(12) United States Patent
Jung et al.

(10) Patent No.: US 9,099,416 B2
(45) Date of Patent: Aug. 4, 2015

(54) ORGANIC LIGHT-EMITTING DEVICE

(71) Applicant: SAMSUNG DISPLAY CO., LTD., Yongin, Gyeonggi-Do (KR)

(72) Inventors: Bo-Ra Jung, Yongin (KR); Seok-Gyu Yoon, Yongin (KR); Dong-Chan Kim, Yongin (KR); Won-Jong Kim, Yongin (KR); Eung-Do Kim, Yongin (KR); Dong-Kyu Seo, Yongin (KR); Da-Hea Im, Yongin (KR); Kyu-Hwan Hwang, Yongin (KR); Young-Woo Song, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/336,989

(22) Filed: Jul. 21, 2014

(65) Prior Publication Data

US 2015/0102305 A1    Apr. 16, 2015

(30) Foreign Application Priority Data

Oct. 11, 2013 (KR) .......................... 10-2013-0121507

(51) Int. Cl.
*H01L 29/08* (2006.01)
*H01L 27/32* (2006.01)
*H01L 51/52* (2006.01)
*H01L 51/50* (2006.01)

(52) U.S. Cl.
CPC ........ *H01L 27/3262* (2013.01); *H01L 27/3216* (2013.01); *H01L 51/5092* (2013.01); *H01L 51/5206* (2013.01); *H01L 51/5221* (2013.01)

(58) Field of Classification Search
CPC ............ H01L 51/5221; H01L 51/5092; H01L 51/5206; H01L 27/3216
USPC .......................................................... 257/40
See application file for complete search history.

(56) References Cited

U.S. PATENT DOCUMENTS

| | | |
|---|---|---|
| 2007/0001586 A1 | 1/2007 | Ryu et al. |
| 2007/0108893 A1 | 5/2007 | Lee et al. |
| 2010/0171107 A1* | 7/2010 | Jung et al. ........................ 257/40 |
| 2011/0133633 A1 | 6/2011 | Yoon et al. |
| 2013/0026456 A1 | 1/2013 | Hwang et al. |
| 2013/0038640 A1 | 2/2013 | Kajimoto |
| 2013/0264549 A1* | 10/2013 | Yamazaki et al. ............... 257/40 |

FOREIGN PATENT DOCUMENTS

| | | |
|---|---|---|
| KR | 2003-0021580 | 3/2003 |
| KR | 10-2006-0097925 | 9/2006 |
| KR | 10-2007-0087773 | 8/2007 |
| KR | 10-2011-0065078 | 6/2011 |
| KR | 10-2012-0119099 | 10/2012 |
| KR | 10-2013-0014103 | 2/2013 |
| KR | 10-2013-0018151 | 2/2013 |

* cited by examiner

*Primary Examiner* — Shaun Campbell
(74) *Attorney, Agent, or Firm* — Christie, Parker & Hale, LLP

(57) ABSTRACT

An organic light-emitting device including a first sub-pixel, a second sub-pixel, and a third sub-pixel on a substrate; a plurality of first electrodes in the first sub-pixel, the second sub-pixel, and the third sub-pixel, respectively; a second electrode being a sub-common layer to the first sub-pixel and the second sub-pixel and facing the first electrodes of the first sub-pixel and the second sub-pixel; and a third electrode in the third sub-pixel and facing the first electrode of the third sub-pixel is disclosed.

20 Claims, 3 Drawing Sheets

ORGANIC LIGHT-EMITTING DEVICE

CROSS-REFERENCE TO RELATED APPLICATION

This application claims priority to and the benefit of Korean Patent Application No. 10-2013-0121507, filed on Oct. 11, 2013, in the Korean Intellectual Property Office, the entire content of which is incorporated herein by reference.

BACKGROUND

1. Field

One or more aspects according to embodiments of the present disclosure relate to an organic light-emitting device.

2. Description of the Related Art

Organic light-emitting devices (OLEDs), which are self-emitting devices, have advantages such as wide viewing angles, excellent contrast, quick response, high brightness, excellent driving voltage characteristics, and can provide multicolored images.

An organic light-emitting device may have a structure in which a first electrode, a hole transport layer (HTL), an emission layer (EML), an electron transport layer (ETL), and a second electrode are sequentially, in that order, on a substrate. Holes injected from the first electrode move to the EML via the HTL, while electrons injected from the second electrode move to the EML via the ETL. The holes and electrons recombine in the EML to generate excitons. When the excitons transition from an excited state to a ground state, light is emitted.

SUMMARY

One or more aspects according to embodiments of the present disclosure are directed toward a high-efficiency organic light-emitting device (OLED) with a low occurrence rate of progressive dark spots.

Additional aspects will be set forth in part in the description which follows and, in part, will be apparent from the description, or may be learned by practice of the embodiments presented herein.

According to one or more embodiments of the present disclosure, an organic light-emitting device includes:

a first sub-pixel, a second sub-pixel, and a third sub-pixel on a substrate;

a plurality of first electrodes in the first sub-pixel, the second sub-pixel, and the third sub-pixel, respectively;

a second electrode being a sub-common layer to the first sub-pixel and the second sub-pixel and facing the first electrodes of the first sub-pixel and the second sub-pixel;

a third electrode in the third sub-pixel and facing the first electrode of the third sub-pixel; and an organic layer including a first emission unit between the first electrode and the second electrode of the first sub-pixel and configured to emit a light of a first color, a second emission unit between the first electrode and the second electrode of the second sub-pixel and configured to emit a light of a second color, and a third emission unit between the first electrode and the third electrode of the third sub-pixel and configured to emit a light of a third color, wherein the light of the third color is blue light, and a mixed light of the light of the first color, the light of the second color, and the light of the third color is white light, and i) the second electrode is substantially free of magnesium (Mg) and the third electrode includes magnesium (Mg); or ii) the second electrode and the third electrode both include magnesium (Mg) according to Formula 1:

$$Con_2(Mg) < Con_3(Mg) \quad \text{Formula 1}$$

wherein, in Formula 1:

$Con_2(Mg)$ is a ratio, by percent, of a volume of magnesium (Mg) in the second electrode to a volume of the second electrode, and $Con_3(Mg)$ is a ratio, by percent, of a volume of magnesium (Mg) in the third electrode to a volume of the third electrode.

The second electrode and the third electrode both may include silver (Ag) according to Formula 2:

$$Con_2(Ag) > Con_3(Ag) \quad \text{Formula 2}$$

wherein, in Formula 2:

$Con_2(Ag)$ is a ratio, by percent, of a volume of silver (Ag) in the second electrode to the volume of the second electrode, and $Con_3(Ag)$ is a ratio, by percent, of a volume of silver (Ag) in the third electrode to the volume of the third electrode.

The second electrode and the third electrode further each independently may include a first metal, and the first metal includes at least one selected from silver (Ag), copper (Cu), gold (Au), zinc (Zn), aluminum (Al), and indium (In).

The second electrode and the third electrode further each independently may include a first material having a work function of about 4.0 eV or less, and the first material includes at least one selected from ytterbium (Yb), lithium (Li), sodium (Na), potassium (K), rubidium (Rb), cesium (Cs), calcium (Ca), strontium (Sr), barium (Ba), radium (Ra), scandium (Sc), yttrium (Y), lanthanum (La), cerium (Ce), ruthenium (Ru), and samarium (Sm).

The second electrode and the third electrode further each independently may include a second material as an electron injection material, and the second material includes at least one selected from an oxide, a fluoride, a quinolate compound, and an acetoacetate compound of an alkali metal and an alkali earth metal.

The second electrode may consist of silver (Ag) and the third electrode may consist of silver (Ag) and magnesium (Mg).

A thickness of the second electrode may be different from a thickness of the third electrode.

The light of the first color may be red light, the light of the second color may be green light, and the organic light-emitting device may satisfy Formula 3:

$$D_1 \geq D_2 > D_3 \quad \text{Formula 3}$$

wherein, in Formula 3:

$D_1$ is a distance between the first electrode and the second electrode in the first sub-pixel, $D_2$ is a distance between the first electrode and the second electrode in the second sub-pixel, and $D_3$ is a distance between the first electrode and the third electrode in the third sub-pixel.

The organic light-emitting may further include a first electron injection layer between the second electrode and the first and second emission units, the first electron injection layer being a sub-common layer to the first sub-pixel and the second sub-pixel; and a second electron injection layer between the third electrode and the third emission unit in the third sub-pixel, wherein the first electron injection layer and the second electron injection layer include materials different from each other.

The first electron injection layer may include a first material having a work function of about 4.0 eV or less, the first material including at least one selected from ytterbium (Yb), lithium (Li), sodium (Na), potassium (K), rubidium (Rb), cesium (Cs), calcium (Ca), strontium (Sr), barium (Ba), radium (Ra), scandium (Sc), yttrium (Y), lanthanum (La), cerium (Ce), ruthenium (Ru), and samarium (Sm), and the second electron injection layer includes a second material as an electron injection material, the second material including at least one selected from an oxide, a fluoride, a quinolate compound, and an acetoacetate compound of an alkali metal and an alkali earth metal.

The organic light-emitting device may further include an electron injection layer as a sub-common layer to the first sub-pixel, the second sub-pixel, and the third sub-pixel.

An edge portion of the second electrode and an edge portion of the third electrode in the third sub-pixel adjacent to the second sub-pixel may be electrically coupled together, and one of the edge portion of the second electrode and the edge portion of the third electrode overlaps the other of the edge portion of the second electrode and the edge portion of the third electrode.

The substrate may include a first transistor electrically coupled to the first electrode of the first sub-pixel; a second transistor electrically coupled to the first electrode of the second sub-pixel; and a third transistor electrically coupled to the first electrode of the third sub-pixel.

According to one or more embodiments of the present disclosure, an organic light-emitting device includes:

a first sub-pixel, a second sub-pixel, and a third sub-pixel on a substrate;

a plurality of first electrodes in the first sub-pixel, the second sub-pixel, and the third sub-pixel, respectively;

a second electrode being a sub-common layer to the first sub-pixel and the second sub-pixel and facing the first electrodes of the first sub-pixel and the second sub-pixel;

a third electrode in the third sub-pixel and facing the first electrode of the third sub-pixel; and an organic layer including a first emission unit between the first electrode and the second electrode of the first sub-pixel and configured to emit a light of a first color, a second emission unit between the first electrode and the second electrode of the second sub-pixel and configured to emit a light of a second color, and a third emission unit between the first electrode and the third electrode of the third sub-pixel and configured to emit a light of a third color, wherein the light of the third color is blue light, and a mixed light of the light of the first color, the light of the second color, and the light of the third color is white light, and an edge portion of the second electrode and an edge portion of the third electrode in the third sub-pixel adjacent to the second sub-pixel are electrically coupled together and one of the edge portion of the second electrode and the edge portion of the third electrode overlaps the other of the edge portion of the second electrode and the edge portion of the third electrode.

In some embodiments, an edge portion of the second electrode and an edge portion of the third electrode in the third sub-pixel adjacent to the second sub-pixel may be electrically coupled together without overlapping with each other.

BRIEF DESCRIPTION OF THE DRAWINGS

These and/or other aspects will become apparent and more readily appreciated by reference to the following description of the embodiments when considered together with the accompanying drawings in which.

DETAILED DESCRIPTION

Figure 1:
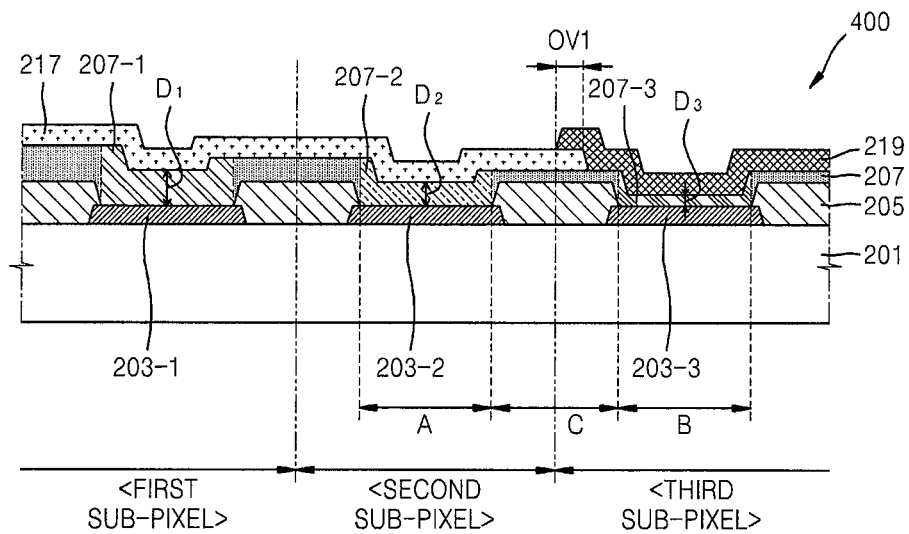
FIG. 1 is a schematic cross-sectional view of an organic light-emitting device according to an embodiment of the present disclosure.

Reference will now be made to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to illustrate and explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure." Also, in the context of the present application, when a first element is referred to as being "on" a second element, it can be directly on the second element or be indirectly on the second element with one or more intervening elements interposed therebetween.

Referring to FIG. 1, an organic light-emitting device 400 according to an embodiment of the present disclosure includes: a first sub-pixel, a second sub-pixel, and a third sub-pixel on a substrate 201; a plurality of first electrodes 203-1, 203-2, and 203-3 in the first sub-pixel, the second sub-pixel, and the third sub-pixel on the substrate 201, respectively; a second electrode 217 in common with (e.g., as a sub-common layer to) the first sub-pixel and the second sub-pixel (e.g., coupled to or in both the first sub-pixel and the second sub-pixel) and opposite to (e.g., facing) the first electrodes 203-1 and 203-2 of the first sub-pixel and the second sub-pixel respectively; a third electrode 219 in the third sub-pixel and opposite to (e.g., facing) the first electrode 203-3 of the third sub-pixel; and an organic layer 207 including a first emission unit 207-1 between the first electrode 203-1 and the second electrode 217 of the first sub-pixel and capable of emitting a light of a first color (e.g., a light having a single first color), a second emission unit 207-2 between the first electrode 203-2 and the second electrode 217 of the second sub-pixel and capable of emitting a light of a second color (e.g., a light having a single second color), and a third emission unit 207-3 between the first electrode 203-3 and the third electrode 219 of the third sub-pixel and capable of emitting a light of a third color (e.g., a light having a single third color).

In the organic light-emitting device 400, the light of the third color may be blue light, and a mixed light of the light of the first color, the light of the second color, and the light of the third color may be white light. Accordingly, the organic light-emitting device 400 may emit light in full color. In some embodiments, the light of the first color may be red light, while the light of the second color may be green light. In some other embodiments, the light of the first color may be green light, while the light of the second color may be red light. However, the present disclosure is not limited thereto, and embodiments of the present disclosure may be implemented in different forms and/or arrangements.

As used herein, the term "common layer" refers to a layer that is over (or under, depending upon the point of view, or in) the first sub-pixel, the second sub-pixel, and the third sub-pixel, and is not patterned into individual layers respectively corresponding to the first sub-pixel, the second sub-pixel, and the third sub-pixel. In addition, as used herein, the term "sub-common layer to the first sub-pixel and the second sub-pixel" refers to a layer that is over (or under, depending upon the point of view, or in) the first sub-pixel and the second sub-pixel, and is not pattered into individual layers respectively corresponding to the first sub-pixel and the second sub-pixel.

The substrate 201 may be any suitable substrate that is used in existing organic light-emitting devices. In some embodiments, the substrate 201 may be a glass substrate or a transparent plastic substrate having strong mechanical strength, thermal stability, transparency, surface smoothness, ease of handling, and water resistance, but the present disclosure is not limited thereto.

The first electrodes 203-1, 203-2, and 203-3 may be formed on the substrate 201 to correspond to the first sub-pixel, the second sub-pixel, and the third sub-pixel, respectively, via patterning. The first electrodes 203-1, 203-2, and 203-3 may be reflective electrodes, transmissive electrodes, or semi-transmissive electrodes.

The first electrodes 203-1, 203-2, and 203-3 may be formed by depositing or sputtering a first electrode forming material onto the substrate 201. When the first electrodes 203-1, 203-2, and 203-3 are anodes, the first electrode forming material may be selected from materials having high work functions to facilitate injection of holes into the first emission unit 207-1, the second emission unit 207-2, and the third emission unit 207-3.

The first electrodes 203-1, 203-2, and 203-3 may include at least one metal, for example, magnesium (Mg), aluminum (Al), aluminum-lithium (Al—Li), calcium (Ca), magnesium-indium (Mg—In), and/or magnesium-silver (Mg—Ag) to form reflective electrodes, but the present disclosure is not limited thereto. In some other embodiments, the first electrodes 203-1, 203-2, and 203-3 may further include, in addition to the above-listed metals, a transparent material having high conductivity, for example, indium tin oxide (ITO), indium zinc oxide (IZO), tin oxide ($SnO_2$), and/or zinc oxide (ZnO). However, the present disclosure is not limited thereto and embodiments of the present disclosure may be implemented in other different forms and/or arrangements.

The first electrodes 203-1, 203-2, and 203-3 may each have a single-layer structure or a multi-layer structure.

For example, the first electrodes 203-1, 203-2, and 203-3 may have a three-layered structure of indium tin oxide (ITO)/Ag/indium tin oxide (ITO), but the first electrodes are not limited thereto.

The first electrodes 203-1, 203-2, and 203-3 may have pixel defining layers 205 along opposite edge portions thereof. The pixel defining layers 205 may define pixel regions, and may include any of a variety of suitable insulating materials used in organic light-emitting devices, such as an organic insulating material (for example, a silicon-based material), an inorganic insulating material, or an organic/inorganic composite insulating material, but the present disclosure is not limited thereto.

The organic layer 207 is on the first electrode 203-1, 203-2, and 203-3.

The organic layer 207 may include at least one layer selected from a hole injection layer (HIL), a hole transport layer (HTL), a buffer layer, an emission layer (EML), a hole blocking layer (HBL), and an electron transport layer (ETL). The HIL, the HTL, the buffer layer, the EML, the HBL, and the ETL may each be formed as a common layer extending over the first sub-pixel, the second sub-pixel, and the third sub-pixel, or as individual layers (e.g., separate layers) respectively corresponding to the first sub-pixel, the second sub-pixel, and the third sub-pixel, via patterning.

The organic layer 207 may include: the first emission unit 207-1 between the first electrode 203-1 and the second electrode 217 of the first sub-pixel and capable of emitting a light of a first color (e.g., a light having a single first color), the second emission unit 207-2 between the first electrode 203-2 and the second electrode 217 of the second sub-pixel and capable of emitting a light of a second color (e.g., a light having a single second color), and the third emission unit 207-3 between the first electrode 203-3 and the third electrode 219 of the third sub-pixel and capable of emitting a light of a third color (e.g., a light having single third color).

When the light of the first color is red light, and the light of the second color is green light, the organic light-emitting device 400 may satisfy Formula 3:

$$D_1 \geq D_2 > D_3 \quad \text{Formula 3}$$

In Formula 3, $D_1$ is a distance between the first electrode 203-1 and the second electrode 217 of the first sub-pixel, $D_2$ is a distance between the first electrode 203-2 and the second electrode 217 of the second sub-pixel, and $D_3$ is a distance between the first electrode 203-3 and the third electrode 219 of the third sub-pixel.

When the organic light-emitting device 400 satisfies the condition of Formula 3, a resonance distance for a wavelength of each of the light of the first color, the light of the second color and/or the light of the third color may be ensured (or provided) in each of the first, second, and third sub-pixels, and thus the organic light-emitting device 400 may have improved emission efficiency.

The organic light-emitting device 400 may include the second electrode 217, which is in common with (e.g., in both) the first sub-pixel and the second sub-pixel (e.g., as a sub-common layer), opposite to (e.g., facing) the first electrodes 203-1 and 203-2 of the first sub-pixel and the second sub-pixel, respectively. The organic light-emitting device 400 may further include the third electrode 219, which is in the third sub-pixel, opposite to (e.g., facing) the first electrode 203-3 of the third sub-pixel.

In some embodiments, the second electrode 217 of the organic light-emitting device 400 does not include magnesium (Mg), and the third electrode 219 may include magnesium (Mg). For example, in some embodiments the second electrode 217 is substantially free from Mg. As used herein, the term "substantially" is used as a term of approximation, and not as a term of degree. In particular, as used herein, "substantially free from Mg" refers to the absence of most Mg, but some trace amount of Mg may be present. In some embodiments, the second electrode 217 is completely free of Mg.

In some embodiments, the second electrode 217 and the third electrode 219 of the organic light-emitting device 400 may both include magnesium (Mg) according to Formula 1 below.

$$\text{Con}_2(Mg) < \text{Con}_3(Mg) \quad \text{Formula 1}$$

In Formula 1, $\text{Con}_2(Mg)$ is a ratio, by percent (e.g., volume percent), of a volume of magnesium (Mg) in the second electrode 217 to a total volume of the second electrode 217, and $\text{Con}_3(Mg)$ is a ratio, by percent (e.g., volume percent), of a volume of magnesium (Mg) in the third electrode 219 to a total volume of the third electrode 219.

The $Con_3(Mg)$ in the third electrode 219 may be about 55% by volume to about 95% by volume, but the third electrode is not limited thereto. For example, the third electrode 219 may be an electrode formed by co-depositing Mg and Ag in a volume ratio of about 9:1.

When the organic light-emitting device 400 satisfies the condition of Formula 3 where $D_3$ is the smallest among $D_1$, $D_2$, and $D_3$, the third emission unit 207-3 of the third sub-pixel is most likely to be damaged from diffusion of metal of the third electrode 219 to the organic layer 207. Accordingly, an occurrence rate of progressive dark spots in the third sub-pixel of the organic light-emitting device 400 may be relatively higher than those in the first sub-pixel and the second sub-pixel.

However, since Mg is an element that may not be substantially diffused into the organic layer 207, when only the third electrode 219 of the organic light-emitting device 400 includes magnesium (Mg) (e.g., the second electrode 217 is free or substantially free of Mg) or the organic light-emitting device 400 satisfies the condition of Formula 1, the relatively higher occurrence rate of progressive dark spots in the third sub-pixel may be reduced.

Therefore, the first sub-pixel, the second sub-pixel, and the third sub-pixel of the organic light-emitting device 400 may all have low occurrence rates of progressive dark spots, and thus the organic light-emitting device 400 as a full color display may have an improved lifetime.

In some embodiments, the second electrode 217 and the third electrode 219 of the organic light-emitting device 400 may both include silver (Ag) according to Formula 2 below.

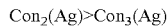

$$Con_2(Ag) > Con_3(Ag) \quad \text{Formula 2}$$

In Formula 2, $Con_2(Ag)$ is a ratio, by percent (e.g., volume percent), of a volume of silver (Ag) in the second electrode 217 to the total volume of the second electrode 217, and $Con_3(Ag)$ is a ratio, by percent (e.g., volume percent), of a volume of silver (Ag) in the third electrode 219 to the total volume of the third electrode 219.

The $Con_2(Ag)$ in the second electrode 217 may be about 55% by volume to about 100% by volume, but the second electrode is not limited thereto. For example, the second electrode 217 may exclusively include Ag. In some embodiments, the second electrode 217 consists of or consists essentially of silver. In some other embodiments, the $Con_2(Ag)$ in the second electrode 217 may be about 55% by volume to about 95% by volume. For example, the second electrode 217 may be an electrode formed by co-depositing Ag and Mg in a volume ratio of about 9:1.

Silver (Ag) is an element with high conductivity facilitating charge injection, and apt to be diffused into the organic layer 207. For example, under the same (or substantially the same) conditions, a diffusion rate of Ag may be higher than that of Mg. Therefore, when the organic light-emitting device 400 satisfies the condition of Formula 2, the first sub-pixel and the second sub-pixel may have high emission efficiencies, while there may occur less diffusion of Ag from the third electrode 219 into the third emission unit 207-3 in the third sub-pixel where the occurrence rate of progressive dark spots is otherwise relatively higher, as compared to the first sub-pixel and the second sub-pixel. Thus, the organic light-emitting device 400 may have an improved lifetime as a full color display.

The second electrode 217 and the third electrode 219 may further each independently include a first metal, in addition to magnesium (Mg). The first metal may include at least one selected from silver (Ag), copper (Cu), gold (Au), zinc (Zn), aluminum (Al), and indium (In).

When the second electrode 217 and the third electrode 219 further includes the first metal, the type (kind) and amount of the first metal in the second electrode 217 may be the same as or different from those of the first metal in the third electrode 219. When the second electrode 217 and the third electrode 219 both include silver (Ag) as the first metal, the organic light-emitting device 400 may satisfy the condition of Formula 2.

The second electrode 217 and the third electrode 219 may further each independently include a first material having a work function of about 4.0 eV or less. The first material may include at least one selected from ytterbium (Yb), lithium (Li), sodium (Na), potassium (K), rubidium (Rb), cesium (Cs), calcium (Ca), strontium (Sr), barium (Ba), radium (Ra), scandium (Sc), yttrium (Y), lanthanum (La), cerium (Ce), ruthenium (Ru), and samarium (Sm), When the second electrode 217 and the third electrode 219 further each independently includes the first material, the type and amount of the first material in the second electrode 217 may be the same as or different from those of the first material in the third electrode 219.

The second electrode 217 and the third electrode 219 may further each independently include a second material as an electron injection material. The second material may include at least one selected from an oxide, a fluoride, a quinolate compound, and an acetoacetate compound of an alkali metal and an alkali earth metal. For example, the second material may include at least one selected from LiF, CsF, $Li_2O$, BaO, and lithium quinolate (Liq).

When the second electrode 217 and the third electrode 219 further includes the second material, the type and amount of the second material in the second electrode 217 may be the same as or different from those of the second material in the third electrode 219.

In some embodiments, the second electrode 217 may include (e.g., consist of) silver (Ag), and the third electrode 219 may include (e.g., consist of) silver (Ag) and magnesium (Mg). In this regard, the $Con_3(Mg)$ of the third electrode 219 may be about 55% by volume to about 95% by volume.

An edge portion of the second electrode 217 may have an overlapping region OV1 in which an edge portion of the second electrode 217 may be electrically connected to (e.g., electrically coupled to), and overlapping with, an edge portion of the third electrode 219 in the third sub-pixel adjacent to the second sub-pixel.

In the overlapping region OV1 of FIG. 1, the edge portion of the second electrode 217 is under the edge portion of the third electrode 219, but embodiments of the present disclosure are not limited thereto. For example, the edge portion of the second electrode 217 may be over the edge portion of the third electrode 219.

The presence of the overlapping region OV1 may reduce sheet resistances of the second electrode 217 and the third electrode 219, so that a rate of charge injection into the organic layer 207 may be improved, and thus the organic light-emitting device 400 may have improved emission efficiency.

In the organic light-emitting device 400 of FIG. 1, at least one of the edge portion of the third electrode 219 and the edge portion of the second electrode 217 may extend to a non-emission region C between an emission region B of the third sub-pixel and an emission region A of the second sub-pixel adjacent to the third sub-pixel. In this embodiment, the edge portion of the third electrode 219 does not extend to an emission region A of the adjacent second sub-pixel, and the edge portion of the second electrode 217 does not extend to the emission region B of the adjacent third sub-pixel.

In the organic light-emitting device 400 of FIG. 1, thicknesses of the second electrode 217 and the third electrode 219 may be the same as or different from each other. In some embodiments, the thicknesses of the second electrode 217 and the third electrode 219 may be different from each other.

A method of manufacturing the organic light-emitting device 100 of FIG. 1, according to an embodiment of the present disclosure, will be described with reference to FIGS. 2A to 2C.

Figure 2A:
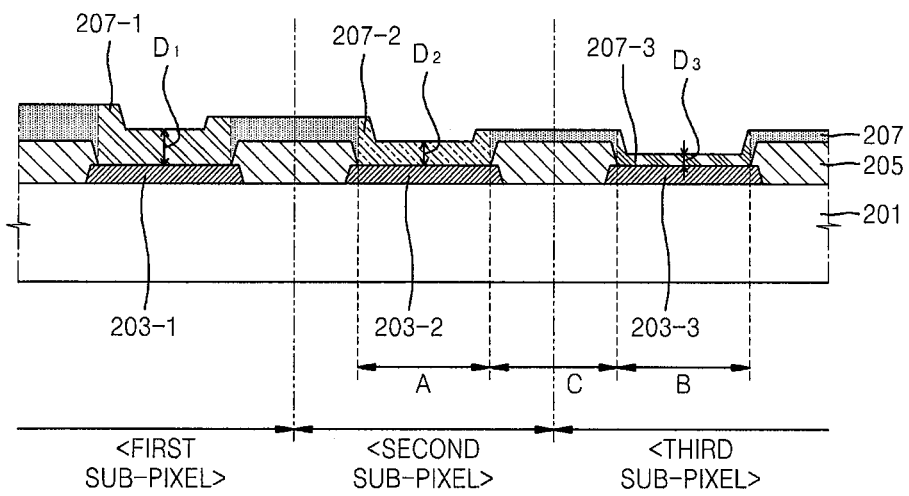
FIGS. 2A to 2C are schematic cross-sectional views sequentially illustrating a method of manufacturing an organic light-emitting device according to another embodiment of the present disclosure.

Referring to FIG. 2A, a plurality of first electrodes 203-1, 203-2, and 203-3 in a first sub-pixel, a second sub-pixel, and a third sub-pixel on a substrate 201, respectively; a pixel defining layer 205; and an organic layer 207 including a first emission unit 207-1 for emitting a light of a first color (e.g., a light having a single first color), a second emission unit 207-2 for emitting a light of a second color (e.g., a light having a single second color), and a third emission unit 207-3 for emitting light of a third color (e.g., a light having a single third color) may be sequentially formed on a substrate 201.

Figure 2B:
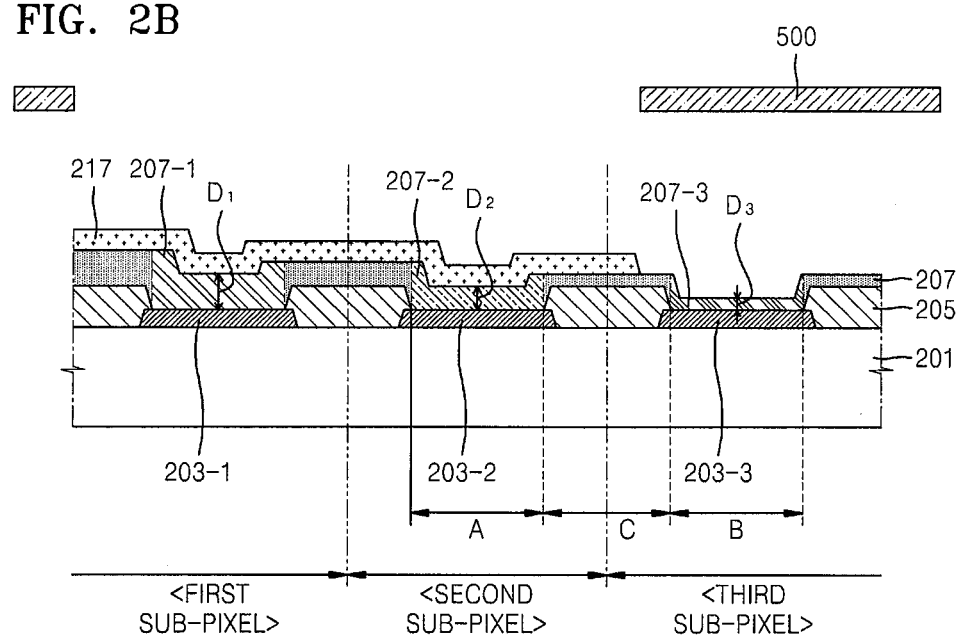

Next, as illustrated in FIG. 2B, a second electrode 217 may be formed on a region of the organic layer 207 that corresponds to the first sub-pixel and the second sub-pixel by using (utilizing) a first mask 500 having an opening corresponding to the first sub-pixel and the second sub-pixel.

The second electrode 217 may be formed using any suitable deposition method used for forming electrodes of organic light-emitting devices. A material for the second electrode 217 may be a material as described above. When the second electrode 217 includes materials that are different from each other, the second electrode 217 may be formed using co-deposition.

An edge portion of the second electrode 217 may extend to a non-emission region C, but without extending to an emission region B of the adjacent third sub-pixel.

Figure 2C:
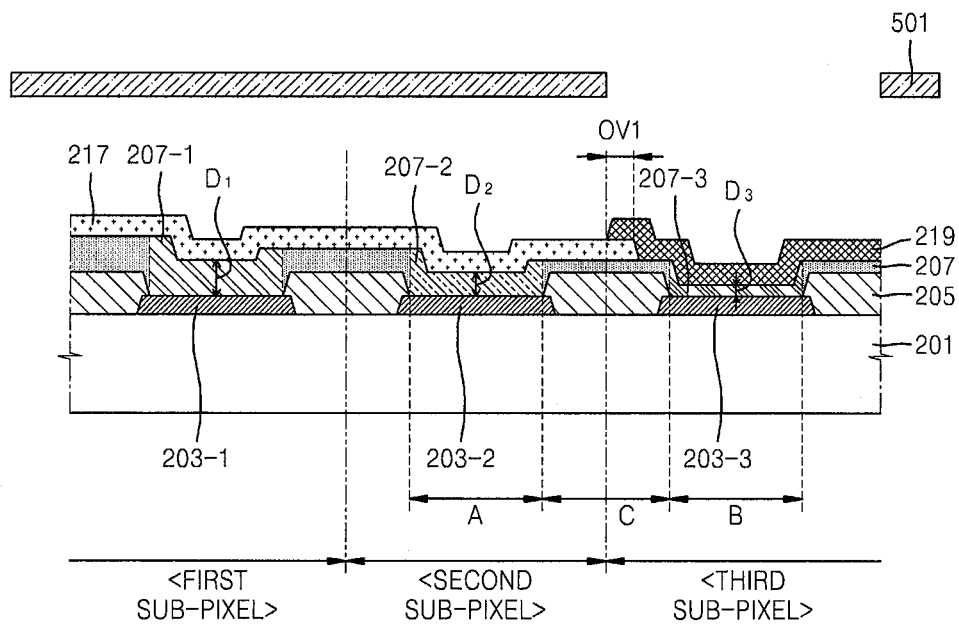

Next, as illustrated in FIG. 2C, a third electrode 219 may be formed on a region of the organic layer 207 that corresponds to the third sub-pixel by using a second mask 501 having an opening corresponding to the third sub-pixel.

The third electrode 219 may be formed using any suitable deposition method used for forming electrodes of organic light-emitting devices. A material for the third electrode 219 may be a material as described above. When the third electrode 219 includes materials that are different from each other, the third electrode 219 may be formed using co-deposition.

An edge portion of the third electrode 219 may extend to the non-emission region C, but without extending to an emission region A of the adjacent second sub-pixel.

Accordingly, an overlapping region OV1, in which respective edge portions of the second electrode 217 and the third electrode 219 are overlapped, is formed.

In the embodiment illustrated in FIGS. 2B and 2C, the forming of the second electrode 217 is followed by the forming of the third electrode 219, but embodiments of the present disclosure are not limited thereto. For example, the forming of the third electrode 219 may be followed by the forming of the second electrode 217.

Figure 3:
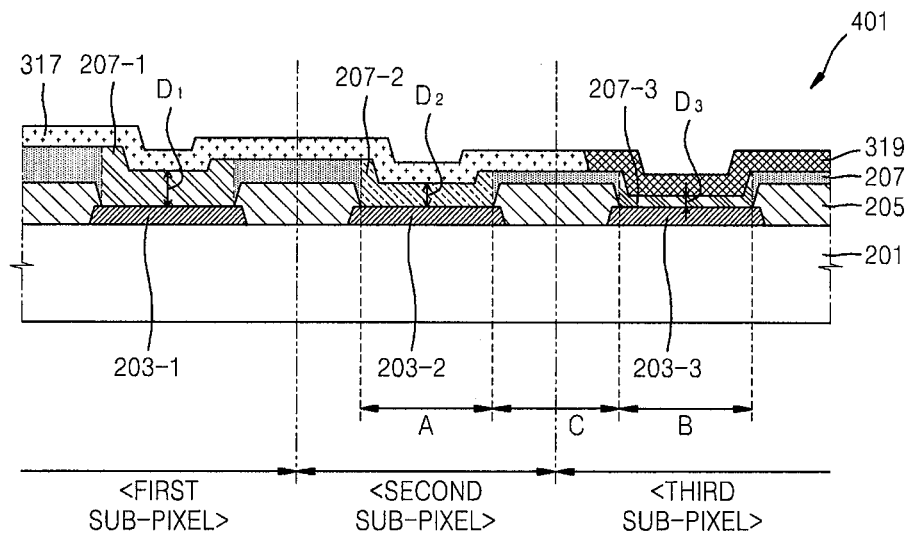
FIG. 3 is a schematic cross-sectional view of an organic light-emitting device according to another embodiment of the present disclosure.

FIG. 3 is a schematic cross-sectional view of an organic light-emitting device 401 according to another embodiment of the present disclosure.

Referring to FIG. 3, regarding a substrate 201, a pixel defining layer 205, an organic layer 207, $D_1$, $D_2$, and $D_3$ in an organic light-emitting device 401, the above-detailed descriptions of the substrate 201, the pixel defining layer 205, the organic layer 207, $D_1$, $D_2$, and $D_3$ in the organic light-emitting device 400 of FIG. 1 may be referred to.

The above-detailed descriptions of the second electrode 217 and the third electrode 219 of the organic light-emitting device 400 of FIG. 2 may be mostly referred to herein for understanding a second electrode 317 and a third electrode 319 of the organic light-emitting device 401 in FIG. 3, except that an edge portion of the second electrode 317 and an edge portion of the third electrode 319 in a third sub-pixel adjacent to a second sub-pixel are electrically connected (e.g., electrically coupled) without overlapping with each other.

At least one of the edge portion of the third electrode 319 and the edge portion of the second electrode 317 in the organic light-emitting device 401 may extend to a non-emission region C between an emission region B of the third sub-pixel and an emission region A of the second sub-pixel adjacent to the third sub-pixel. In this embodiment, the edge portion of the third electrode 319 does not extend to the emission region of the adjacent second sub-pixel, and the edge portion of the second electrode 317 does not extend to the emission region B of the adjacent sub-pixel.

Figure 4:
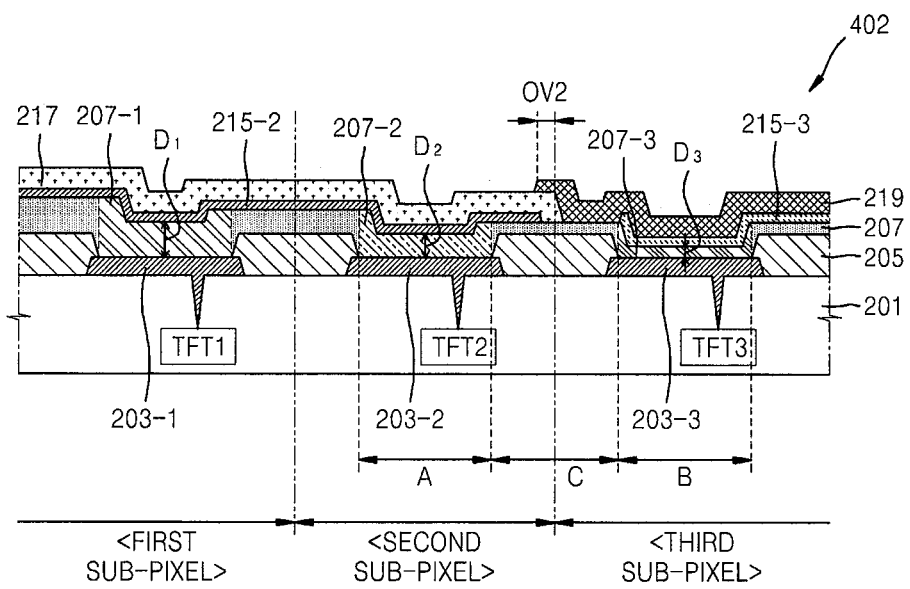
FIG. 4 is a schematic cross-sectional view of an organic light-emitting device according to another embodiment of the present disclosure.

FIG. 4 is a schematic cross-sectional view of an organic light-emitting device 402 according to another embodiment of the present disclosure.

The above-detailed descriptions of the organic light-emitting device 400 of FIG. 1 may be mostly referred to herein for understanding the organic light-emitting device 402 of FIG. 4, except that i) the organic light-emitting device 402 further includes a first electron injection layer 215-2 between the second electrode 217 and the first and second emission units 207-1 and 207-2 as a common layer of the first sub-pixel and the second sub-pixel, and a second electron injection layer 215-3 between the third emission unit 207-3 and the third electrode 219 in the third sub-pixel, and that ii) the organic light-emitting device 402 further includes a thin film transistor (TFT) in a substrate 201.

In the organic light-emitting device 402 of FIG. 4, the first electron injection layer 215-2 may directly contact (e.g., physically contact) the second electrode 217, which is on the first injection layer 215-2, and the second electron injection layer 215-3 may directly contact (e.g., physically contact) the third electrode 219, which is also on the second electron injection layer 215-3.

A material of the first electron injection layer 215-2 may be different from a material of the second electron injection layer 215-3.

For example, the first electron injection layer 215-2 may include a first material having a work function of about 4.0 eV or less, but the first material is not limited thereto. The first material may include at least one selected from ytterbium (Yb), lithium (Li), sodium (Na), potassium (K), rubidium (Rb), cesium (Cs), calcium (Ca), strontium (Sr), barium (Ba), radium (Ra), scandium (Sc), yttrium (Y), lanthanum (La), cerium (Ce), ruthenium (Ru), and samarium (Sm), but the first material is not limited thereto.

The second electron injection layer 215-3 may include a second material as an electron injection material. The second material may include at least one selected from an oxide, a fluoride, a quinolate compound, and an acetoacetate compound of an alkali metal and an alkali earth metal, but the second material is not limited thereto. For example, the second electron injection layer 215-3 may include at least one selected from LiF, CsF, $Li_2O$, BaO, and lithium quinolate (Liq), but the second electron injection layer is not limited thereto.

The first electron injection layer 215-2 may be formed on the organic layer 207 after placing the first mask 500 described with reference to FIG. 2B on the organic layer 207 and before forming the second electrode 217.

The second electron injection layer 215-3 may be formed on the organic layer 207 after placing the second mask 501 described with reference to FIG. 2C on the organic layer 207 and before forming the third electrode 219.

Referring to FIG. 4, the substrate 201 of the organic light-emitting device 402 may include a first transistor TFT1 electrically connected to (e.g., coupled to) a first electrode 203-1 of the first sub-pixel, a second transistor TFT2 electrically connected to (e.g., coupled to) a first electrode 203-2 of the second sub-pixel, and a third transistor TFT3 electrically connected to (e.g., coupled to) a first electrode 203-3 of the third sub-pixel. Accordingly, the organic light-emitting device 402 may be an active matrix organic light-emitting device.

The first electrode 203-1 of the first sub-pixel may be electrically connected to (e.g., coupled to) one of source and drain electrodes of the first transistor TFT1, the first electrode 203-2 of the second sub-pixel may be electrically connected to (e.g., coupled to) one of source and drain electrodes of the second transistor TFT2, and the first electrode 203-3 of the third sub-pixel may be electrically connected to (e.g., coupled to) one of source and drain electrodes of the third transistor TFT3.

Although the organic light-emitting devices according to embodiments of the present disclosure are described above with reference to FIGS. 1, 2A, 2B, 2C, 3, and 4, embodiments of the present disclosure are not limited thereto. For example, the organic light-emitting device 400 of FIG. 1 may further include an electron injection layer between the organic layer 207 and the second and third electrodes 217 and 219, as a common layer of the first sub-pixel, the second sub-pixel, and the third sub-pixel. The electron injection layer as a common layer of the first sub-pixel, the second sub-pixel, and the third sub-pixel may include at least one of a first material having a work function of about 4.0 eV or less, and a second material as an electron injection material.

In some embodiments, the organic light-emitting device 400 of FIG. 1 may further include transistors TFT1, TFT2, and TFT3 as illustrated in FIG. 4, but embodiments of the organic light-emitting device 400 are not limited thereto.

In the organic light-emitting devices 400, 401, and 402 of FIGS. 1, 3, and 4, the first electrodes 203-1, 203-2, and 203-3 may be anodes, and the second electrodes 217 and 317 and the third electrodes 219 and 319 may be cathodes. In some other embodiments, the first electrodes 203-1, 203-2, and 203-3 may be cathodes, and the second electrodes 217 and 317 and the third electrodes 219 and 319 may be anodes.

A performance test on organic light-emitting devices OLED 1, OLED 2, and OLED 3 that were manufactured as described below, was performed to observe efficiency and occurrence rate of dark spots of the organic light-emitting devices.

Anodes and organic layers of the organic light-emitting devices OLED 1, OLED 2, and OLED 3 were manufactured as follows. First, after an ITO/Ag/ITO anode (a first electrode) was formed on a glass substrate as a pattern corresponding to each of a first sub-pixel (capable of emitting red light), a second sub-pixel (capable of emitting green light), and a third sub-pixel (capable of emitting blue light), a pixel defining layer was formed to define pixel regions, and a hole injection layer and a hole transport layer as common layers of the first, second, and third sub-pixels were formed on the anode. After forming a first buffer layer and a red emission layer in the first sub-pixel, a second buffer layer and a green emission layer in the second sub-pixel, and a blue emission layer in the third sub-pixel via patterning, an electron transport layer was formed thereon as a common layer of the first, second, and third sub-pixels. The above-described structures of the anode and the organic layers were the same among the organic light-emitting devices OLED 1, OLED 2, and OLED 3.

Next, an electron injection layer and a cathode were formed on the resultant structure including the anode and the organic layers described above to provide structures as set forth in Table 1, followed by forming a capping layer on the cathode, thereby completing the manufacture of the organic light-emitting devices OLED 1, OLED 2, and OLED 3.

TABLE 1

| | OLED Structure | First sub-pixel (emitting red light) | Second sub-pixel (emitting green light) | Third sub-pixel (emitting blue light) |
|---|---|---|---|---|
| OLED 1 | Cathode (second electrode/third electrode) | AgMg[1] second electrode (80 Å thickness) | | MgAg[2] third electrode (120 Å thickness) |
| | Electron injection layer (first electron injection layer/second electron injection layer) | Yb first electron injection layer (15 Å thickness) | | Liq second electron injection layer (15 Å thickness) |
| OLED 2 | Cathode (common layer) | MgAg[2] layer (120 Å thickness) | | |
| | Electron injection layer (common layer) | Liq layer (15 Å thickness) | | |
| OLED 3 | Cathode (common layer) | AgMg[1] layer (80 Å thickness) | | |
| | Electron injection layer (common layer) | Yb layer (15 Å thickness) | | |

[1]formed by co-deposition of Ag and Mg in a volume ratio of about 9:1.
[2]formed by co-deposition of Mg and Ag in a volume ratio of about 9:1.

The second electrode, the third electrode, the first electron injection layer, and the second electron injection layer of the organic light-emitting device OLED 1 had the same (or substantially the same) structure as the second electrode 217, the third electrode 219, the first electron injection layer 215-2, and the second electron injection layer 215-3 of the organic light-emitting device 402 of FIG. 4.

White-light emission efficiencies of the organic light-emitting devices OLED 1 and OLED 2 were evaluated using a Kethley Source-Measure Unit (SMU) 236 and a PR650 Spectroscan (available from Photo Research, Inc.). The white-light emission efficiencies of the organic light-emitting devices OLED 1 and OLED 2 were found to be about 16.9 cd/A and about 14.8 cd/A, respectively.

An occurrence rate of dark spots in each of the organic light-emitting devices OLED 1 and OLED 3, represented as [(Number of dark spots)/(Number of cells)×100(%)], was calculated after each organic light-emitting device was operated at a temperature of about −20° C. and a relative humidity of about 0% for about 120 hours at 300 nit (1 nit being equal to one candle per square meter). The occurrence rates of dark spots in the organic light-emitting devices OLED 1 and OLED 3 were found to be about 18.41% and about 21.82%, respectively.

These results indicate that the organic light-emitting device OLED 1 had an improved lifetime and improved efficiency compared to the other organic light-emitting devices OLED 2 and OLED 3.

As described above, according to the one or more of the above embodiments, an organic light-emitting device may have high improved efficiency and a long lifetime.

It should be understood that the embodiments described herein should be considered in a descriptive sense only and not for purposes of limitation. Descriptions of features or aspects within each embodiment should typically be considered as available for other similar features or aspects in other embodiments.

While certain embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light-emitting device comprising:
a first sub-pixel, a second sub-pixel, and a third sub-pixel on a substrate;
a plurality of first electrodes in the first sub-pixel, the second sub-pixel, and the third sub-pixel, respectively;
a second electrode being a sub-common layer to the first sub-pixel and the second sub-pixel and facing the first electrodes of the first sub-pixel and the second sub-pixel;
a third electrode in the third sub-pixel and facing the first electrode of the third sub-pixel wherein the third electrode does not extend to an emission region of the first sub-pixel; and
an organic layer comprising a first emission unit between the first electrode and the second electrode of the first sub-pixel and configured to emit a light of a first color, a second emission unit between the first electrode and the second electrode of the second sub-pixel and configured to emit a light of a second color, and a third emission unit between the first electrode and the third electrode of the third sub-pixel and configured to emit a light of a third color,
wherein the light of the third color is blue light, and a mixed light comprising the light of the first color, the light of the second color, and the light of the third color is white light, and
i) the second electrode is substantially free of magnesium (Mg) and the third electrode comprises magnesium (Mg); or ii) the second electrode and the third electrode both include magnesium (Mg) according to Formula 1:

$$Con_2(Mg) < Con_3(Mg) \quad \text{Formula 1}$$

wherein, in Formula 1:
$Con_2(Mg)$ is a ratio, by percent, of a volume of magnesium (Mg) in the second electrode to a total volume of the second electrode, and
$Con_3(Mg)$ is a ratio, by percent, of a volume of magnesium (Mg) in the third electrode to a volume of the third electrode.

2. The organic light-emitting device of claim 1, wherein the second electrode and the third electrode both comprise silver (Ag) according to Formula 2:

$$Con_2(Ag) > Con_3(Ag) \quad \text{Formula 2}$$

wherein, in Formula 2,
$Con_2(Ag)$ is a ratio, by percent, of a volume of silver (Ag) in the second electrode to the volume of the second electrode, and
$Con_3(Ag)$ is a ratio, by percent, of a volume of silver (Ag) in the third electrode to the volume of the third electrode.

3. The organic light-emitting device of claim 1, wherein the second electrode and the third electrode each independently further comprises a first metal, and the first metal comprises at least one selected from silver (Ag), copper (Cu), gold (Au), zinc (Zn), aluminum (Al), and indium (In).

4. The organic light-emitting device of claim 1, wherein the second electrode and the third electrode each independently further comprises a first material having a work function of about 4.0 eV or less, and the first material comprises at least one selected from ytterbium (Yb), lithium (Li), sodium (Na), potassium (K), rubidium (Rb), cesium (Cs), calcium (Ca), strontium (Sr), barium (Ba), radium (Ra), scandium (Sc), yttrium (Y), lanthanum (La), cerium (Ce), ruthenium (Ru), and samarium (Sm).

5. The organic light-emitting device of claim 1, wherein the second electrode and the third electrode each independently further comprises a second material as an electron injection material, and the second material comprises at least one selected from an oxide, a fluoride, a quinolate compound, and an acetoacetate compound of an alkali metal and an alkali earth metal.

6. The organic light-emitting device of claim 1, wherein a thickness of the second electrode is different from a thickness of the third electrode.

7. The organic light-emitting device of claim 1, wherein the light of the first color is red light, the light of the second color is green light, and the organic light-emitting device satisfies Formula 3:

$$D_1 > D_2 > D_3 \quad \text{Formula 3}$$

wherein, in Formula 3:
$D_1$ is a distance between the first electrode and the second electrode in the first sub-pixel,
$D_2$ is a distance between the first electrode and the second electrode in the second sub-pixel, and
$D_3$ is a distance between the first electrode and the third electrode in the third sub-pixel.

8. An organic light-emitting device comprising:
a first sub-pixel, a second sub-pixel, and a third sub-pixel on a substrate;
a plurality of first electrodes in the first sub-pixel, the second sub-pixel, and the third sub-pixel, respectively;
a second electrode being a sub-common layer to the first sub-pixel and the second sub-pixel and facing the first electrodes of the first sub-pixel and the second sub-pixel;
a third electrode in the third sub-pixel and facing the first electrode of the third sub-pixel;
an organic layer comprising a first emission unit between the first electrode and the second electrode of the first sub-pixel and configured to emit a light of a first color, a second emission unit between the first electrode and the second electrode of the second sub-pixel and configured to emit a light of a second color, and a third emission unit between the first electrode and the third electrode of the third sub-pixel and configured to emit a light of a third color, a first electron injection layer between the second electrode and the first and second emission units, the first electron injection layer being a sub-common layer to the first sub-pixel and the second sub-pixel; and a second electron injection layer between the third electrode and the third emission unit in the third sub-pixel, wherein the first electron injection layer and the second electron injection layer comprise materials different from each other, wherein the light of the third color is blue light, and a mixed light comprising the light of the first color, the light of the second color, and the light of the third color is white light, and i) the second electrode is substantially free of magnesium (Mg) and the third electrode comprises magnesium (Mg); or ii) the second electrode and the third electrode both include magnesium (Mg) according to Formula 1:

$$Con_2(Mg) < Con_3(Mg) \qquad \text{Formula 1}$$

wherein, in Formula 1:

$Con_2(Mg)$ is a ratio, by percent, of a volume of magnesium (Mg) in the second electrode to a total volume of the second electrode, and $Con_3(Mg)$ is a ratio, by percent, of a volume of magnesium (Mg) in the third electrode to a volume of the third electrode.

9. The organic light-emitting device of claim 8, wherein the first electron injection layer comprises a first material having a work function of about 4.0 eV or less, the first material comprising at least one selected from ytterbium (Yb), lithium (Li), sodium (Na), potassium (K), rubidium (Rb), cesium (Cs), calcium (Ca), strontium (Sr), barium (Ba), radium (Ra), scandium (Sc), yttrium (Y), lanthanum (La), cerium (Ce), ruthenium (Ru), and samarium (Sm), and the second electron injection layer comprises a second material as an electron injection material, the second material comprising at least one selected from an oxide, a fluoride, a quinolate compound, and an acetoacetate compound of an alkali metal and an alkali earth metal.

10. The organic light-emitting device of claim 1, further comprising an electron injection layer as a sub-common layer to the first sub-pixel, the second sub-pixel, and the third sub-pixel.

11. The organic light-emitting device of claim 1, wherein an edge portion of the second electrode and an edge portion of the third electrode in the third sub-pixel adjacent to the second sub-pixel are electrically coupled together, and one of the edge portion of the second electrode and the edge portion of the third electrode overlaps the other of the edge portion of the second electrode and the edge portion of the third electrode.

12. The organic light-emitting device of claim 11, wherein at least one of the edge portion of the third electrode and the edge portion of the second electrode extends to a non-emission region between an emission region of the third sub-pixel and an emission region of the second sub-pixel adjacent to the third sub-pixel, the edge portion of the third electrode does not extend to the emission region of the adjacent second sub-pixel, and the edge portion of the second electrode does not extend to the emission region of the adjacent to the third sub-pixel.

13. The organic light-emitting device of claim 1, wherein an edge portion of the second electrode and an edge portion of the third electrode in the third sub-pixel adjacent to the second sub-pixel are electrically coupled together without overlapping with each other.

14. The organic light-emitting device of claim 13, wherein at least one of the edge portion of the third electrode and the edge portion of the second electrode extends to a non-emission region between an emission region of the third sub-pixel and an emission region of the second sub-pixel adjacent to the third sub-pixel, the edge portion of the third electrode does not extend to the emission region of the adjacent second sub-pixel, and the edge portion of the second electrode does not extend to the emission region of the adjacent to the third sub-pixel.

15. The organic light-emitting device of claim 1, wherein the substrate comprises:

a first transistor electrically coupled to the first electrode of the first sub-pixel;

a second transistor electrically coupled to the first electrode of the second sub-pixel; and a third transistor electrically coupled to the first electrode of the third sub-pixel.

16. An organic light-emitting device comprising:

a first sub-pixel, a second sub-pixel, and a third sub-pixel on a substrate;

a plurality of first electrodes in the first sub-pixel, the second sub-pixel, and the third sub-pixel, respectively;

a second electrode being a sub-common layer to the first sub-pixel and the second sub-pixel and facing the first electrodes of the first sub-pixel and the second sub-pixel;

a third electrode in the third sub-pixel and facing the first electrode of the third sub-pixel, wherein the third electrode does not extend to an emission region of the first sub-pixel; and an organic layer comprising a first emission unit between the first electrode and the second electrode of the first sub-pixel and configured to emit a light of a first color, a second emission unit between the first electrode and the second electrode of the second sub-pixel and configured to emit a light of a second color, and a third emission unit between the first electrode and the third electrode of the third sub-pixel and configured to emit a light of a third color, wherein the light of the third color is blue light, and a mixed light comprising the light of the first color, the light of the second color, and the light of the third color is white light, and an edge portion of the second electrode and an edge portion of the third electrode in the third sub-pixel adjacent to the second sub-pixel are electrically coupled together and one of the edge portion of the second electrode and the edge portion of the third electrode overlaps the other of the edge portion of the second electrode and the edge portion of the third electrode.

17. The organic light-emitting device of claim 16, wherein at least one of the edge portion of the third electrode and the edge portion of the second electrode extends to a non-emission region between an emission region of the third sub-pixel and an emission region of the second sub-pixel adjacent to the third sub-pixel, the edge portion of the third electrode does not extend to the emission region of the adjacent second sub-pixel, and the edge portion of the second electrode does not extend to the emission region of the adjacent third sub-pixel.

18. The organic light-emitting device of claim 16, wherein the light of the first color is red light, the light of the second color is green light, and the organic light-emitting device satisfies Formula 3:

$$D_1 \geq D_2 > D_3 \qquad \text{Formula 3}$$

wherein, in Formula 3:
- $D_1$ is a distance between the first electrode and the second electrode in the first sub-pixel,
- $D_2$ is a distance between the first electrode and the second electrode in the second sub-pixel, and
- $D_3$ is a distance between the first electrode and the third electrode in the third sub-pixel.

19. The organic light-emitting device of claim 16, further comprising:
- a first electron injection layer between the second electrode and the first and second emission units, the first electron injection layer being a sub-common layer to the first sub-pixel and the second sub-pixel; and
- a second electron injection layer between the third electrode and the third emission unit in the third sub-pixel,
- wherein the first electron injection layer and the second electron injection layer comprise materials different from each other.

20. The organic light-emitting device of claim 16, wherein the substrate comprises:
- a first transistor electrically coupled to the first electrode of the first sub-pixel;
- a second transistor electrically coupled to the first electrode of the second sub-pixel; and
- a third transistor electrically coupled to the first electrode of the third sub-pixel.

* * * * *